May 6, 1969 D. E. FYNN ET AL 3,443,238

TRANSISTOR CASCODE AMPLIFIER WITH MEANS TO PREVENT OSCILLATIONS

Filed May 5, 1966

INVENTORS
David Ernest Fynn
and
Alfred Ronald Deeley
BY Baldwin & Wight
ATTORNEYS

United States Patent Office 3,443,238
Patented May 6, 1969

3,443,238

TRANSISTOR CASCODE AMPLIFIER WITH MEANS TO PREVENT OSCILLATIONS

David Ernest Fynn and Alfred Ronald Deeley, Essex, England, assignors to The Marconi Company Limited, London, England, a British company Filed May 5, 1966, Ser. No. 547,932
Claims priority, application Great Britain, July 3, 1965, 28,260/65
Int. Cl. H03f *3/42, 3/18, 1/14*
U.S. Cl. 330—18 1 Claim

ABSTRACT OF THE DISCLOSURE

A transistor amplifier having two transistors in cascode connection. The emitter-collector connection of the two transistors is connected through a capacitance to a point, preferably high frequency ground, common to the input and output circuit. In preferred embodiments the reactance provided by the aforementioned capacitance, together with the reactance of the output impedance of the stage including the transistor whose collector is connected to the emitter-collector connection, is less than half the minimum reactance of the other transistor when its output is short-circuited.

This invention relates to high frequency transistor amplifiers and more specifically to high frequency transistor amplifiers comprising transistors in so-called cascode connection. Such amplifiers will hereinafter be referred to as cascode transistor amplifiers.

Figure 1:
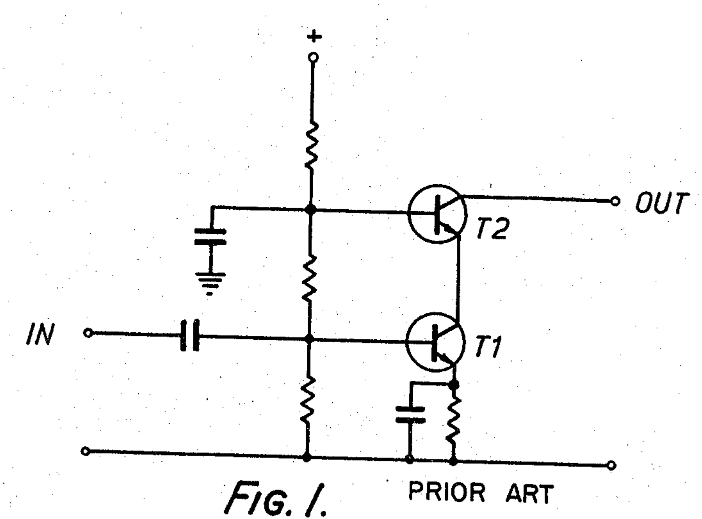
FIG. 1. PRIOR ART
Figure 2:
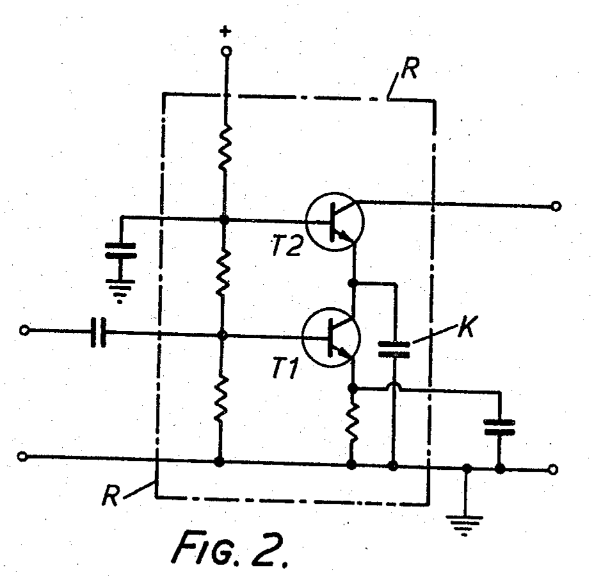

The invention is illustrated in and further explained in connection with the accompanying drawings in which FIGURE 1, which is provided for purposes of explanation, is a simplified circuit diagram of a typical known cascode transistor amplifier and FIGURE 2 is a simplified diagram of a cascode amplifier embodying the present invention.

The known amplifier of FIGURE 1 comprises two transistors T1 T2 in cascode connection, the "live" input terminal of the amplifier being referenced IN and the "live" output terminal being referenced OUT. Input is applied to the base of T1 and output taken from the collector of T2, the collector of T1 being connected to the emitter of T2. In FIGURE 1 the transistors are shown as of the NPN type but, of course, with suitable and well known changes, PNP transistors could equally well be used. Obviously also the chain of resistors shown for applying appropriate D.C. voltages to the base of each transistor illustrates only one of several known methods which can be used for the purpose.

In general transistor amplifiers are designed to operate with the transistors well below their cut-off frequency. It may be shown, however, that the transistor T2 of FIGURE 1, which of course operates in common base mode is inherently a generator having a certain natural frequency for all input loading conditions of T1 and, because of this, it is difficult to embody the circuit of FIGURE 1 in a high frequency amplifier structure of such physical dimensions as to be free of liability to produce spurious oscillations at the natural frequency of transistor T2, regarded as a generator. When frequencies of the order of 100 mc./s. are to be amplified, serious difficulties are experienced in preventing undesired generation of spurious oscillations as above described especially if the amplifier is embodied, in accordance with the known and commonly desired so-called micro-miniaturisation practice, in a so-called "module" so as to be of very small size physically. The present invention seeks to overcome these difficulties.

According to this invention the emitter-collector connection of two transistors in cascode amplifier connection is connected through a capacitance to a point which is common to the input and output circuits of the cascode amplifier. Preferably this point is high frequency earth.

Preferably said capacitance is so dimensioned that its reactance, together with that of the output impedance of the stage including the transistor whose collector is connected to the said emitter-collector connection, is less than half the minimum reactance of the other transistor when its output is short circuited.

Simple and inexpensive though the invention is to put into practice, it provides a marked improvement in stability and freedom from spurious oscillation. It may be shown that, if the capacitance added by this invention is dimensioned as above stated, the amplifier is inherently stable and will not oscillate unless positive feedback is deliberately applied and, furthermore, that this inherent stability is obtained without loss of stable voltage gain.

The embodiment shown in FIGURE 2 differs from the known amplifier of FIGURE 1 only by the addition of the condenser K which is dimensioned as above described. In a practical amplifier as represented in FIGURE 2 and which was experimentally constructed and tested as a wide band amplifier for frequencies centered at about 100 mc./s. and employed transistors having a cut-off frequency of about 600 mc./s., the capacitance of the condenser K was approximately 15 pfd. The parts shown within the chain line rectangle R were embodied in a so-called module in accordance with micro-miniaturisation practice known per se and housed in a very small screening can. Satisfactory stable amplification without spurious oscillation generation was obtained.

Obviously in FIGURE 2 as in FIGURE 1 PNP transistors could be employed instead of NPN transistors.

We claim:

1. A transistor amplifier including two transistors in cascode connection with respect to both D.C. and R.F., the emitter-collector connection of the said two transistors being connected through a capacitance to a point which is common to the input and output circuits of the amplifier, said capacitance being so dimensioned that its reactance, together with that of the output impedance of the stage including the transistor whose collector is connected to the said emitter-collector connection, is less than half the minimum reactance of the other transistor when its output is short circuited.

References Cited

UNITED STATES PATENTS

| | | | |
|---|---|---|---|
| 2,929,025 | 3/1960 | Wilhelmsen | 330—18 |
| 3,177,439 | 4/1965 | Tulp et al. | 330—18 |

ROY LAKE, *Primary Examiner.*

SIEGFRIED H. GRIMM, *Assistant Examiner.*

U.S. Cl. X.R.

330—27, 70